(12) United States Patent
Jo

(10) Patent No.: US 7,365,020 B2
(45) Date of Patent: Apr. 29, 2008

(54) METHOD FOR ETCHING UPPER METAL OF CAPACITATOR

(75) Inventor: Bo Yeoun Jo, Icheon (KR)

(73) Assignee: Donbu Electronics Co., Ltd., Seoul (KR)

( * ) Notice: Subject to any disclaimer, the term of this patent is extended or adjusted under 35 U.S.C. 154(b) by 248 days.

(21) Appl. No.: 11/024,727

(22) Filed: Dec. 30, 2004

(65) Prior Publication Data
US 2005/0153516 A1    Jul. 14, 2005

(30) Foreign Application Priority Data
Dec. 31, 2003   (KR)   ............ 10-2003-0102027

(51) Int. Cl.
H01L 21/302  (2006.01)
H01L 21/306  (2006.01)
H01L 21/3213  (2006.01)

(52) U.S. Cl. ............ 438/734; 438/396; 438/673; 438/738

(58) Field of Classification Search ........ 438/381, 438/393, 396
See application file for complete search history.

(56) References Cited

U.S. PATENT DOCUMENTS 6,380,579 B1 * 4/2002 Nam et al. .......... 257/306
6,602,434 B1 * 8/2003 Hung et al. .......... 216/39
2004/0196618 A1 * 10/2004 Komuro et al. .......... 361/306.3

* cited by examiner

*Primary Examiner*—Mary Wilczewski
*Assistant Examiner*—Pamela E Perkins
(74) *Attorney, Agent, or Firm*—Lowe Hauptman Ham & Berner LLP

(57) ABSTRACT

A method for etching an upper metal film of a capacitor, enables a safe etching of the upper metal film of a capacitor by exploiting an over-etch step. The method for etching the upper metal film of the capacitor includes the steps of forming a lower metal film, a lower nitride film, an upper metal film, and an upper nitride film on a substrate having a predetermined device formed thereon, and then forming a pattern thereover; etching the upper nitride film with $CHF_3$, Ar and $Cl_2$ using the pattern; over etching the upper metal film more than 50% with $CHF_3$, Ar and $N_2$ using the pattern; etching the upper metal film with $CHF_3$, Ar and $N_2$ using the pattern; and etching the lower nitride film with $CHF_3$ and Ar using the pattern.

6 Claims, 1 Drawing Sheet

METHOD FOR ETCHING UPPER METAL OF CAPACITOR

BACKGROUND OF THE INVENTION

1. Field of the Invention

The present invention relates to a method for etching an upper metal of a capacitor, and more particularly, to a method for forming an upper metal layer of a capacitor by over etching more than 50% in combination with using $CHF_3$, Ar, and $N_2$.

2. Discussion of the Related Art

Recently, as a degree of device integration becomes higher, a cell area allocated for reading and recording an electric signal is gradually reduced.

For example, in a case of 256 Mb DRAM, the cell area is 0.5 μm². In this case, an area allocated to a capacitor, as one of basic elements of the cell, should be less than 0.3 μm ².

According to such an improvement of integration of the semiconductor device, a method has been introduced for forming the capacitor with a dielectric film having a high electric constant, forming the dielectric film to be thin, or increasing an area of the capacitor, so as to secure high capacitance in a small area.

In order to increase the area of the capacitor, many techniques are introduced such as a technique for forming a multilayer capacitor or a trench capacitor, or a technique for employing a semi spherical poly silicon film. Those techniques however have problems of making the structure of the capacitor, and, owing to the complicated fabrication process, increasing manufacturing cost and lowering yield.

The dielectric substance of $SiO_2/Si_3N_4$ is commonly employed for the dielectric film of the capacitor, and according to an electrode substance used for the capacitor, Poly insulator poly (PIP) capacitor, or MIM capacitor is employed. Contrary to a junction capacitor, since a thin film type capacitor such as the PIP capacitor or the MIM capacitor is independent of bias, it is widely used in analog products demanding great precision.

In the case of a MIM capacitor, there is a disadvantage that it is difficult to make the capacitor with larger capacitance per unit area than the PIP capacitor. On the other hand, there is an advantage that, since the voltage coefficient for capacitor (Vcc) and temperature coefficient for capacitor (TCC) of the capacitance according to voltage or temperature are better than those of the PIP capacitor, it is easy to make the analog product with high precision.

Owing to an allergy reaction at an area conjunction with a lower layer, the method for etching an upper metal layer of a conventional capacitor as above described has a problem of causing an inferior formation of the upper metal layer and a metal pattern in the end. Moreover, the present inventor recognized that by etching the upper metal in one step, "notches" are formed at edges of the upper metal layer and lower nitride layer. Also, the inventor recognized that one step removal of the upper metal causes a polymer to form and an uneven SiN layer remains.

SUMMARY OF THE INVENTION

Accordingly, the present invention is directed to a method for etching the upper metal film of the capacitor that substantially obviates the above-identified and other problems due to limitations and disadvantages of the related art.

An object of the present invention is to provide a method for etching the upper metal film of a capacitor that can be done safely and enhance a MIM characteristic by over etching more than 50% with $CHF_3$, Ar, and $N_2$, thereby securing safety for unit process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for etching the upper metal film of the capacitor includes the steps of forming a lower metal film, a lower nitride film, an upper metal film, and an upper nitride film on a substrate having a predetermined device formed thereon, and then forming a pattern thereover; etching the upper nitride film with $CHF_3$, Ar and $N_2$ using the pattern; over etching the upper metal film more than 50% with $CHF_3$, Ar and $N_2$ using the pattern; etching the upper metal film with $CHF_3$, Ar and $N_2$ using the pattern; and etching the lower nitride film with $CHF_3$ and Ar using the pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
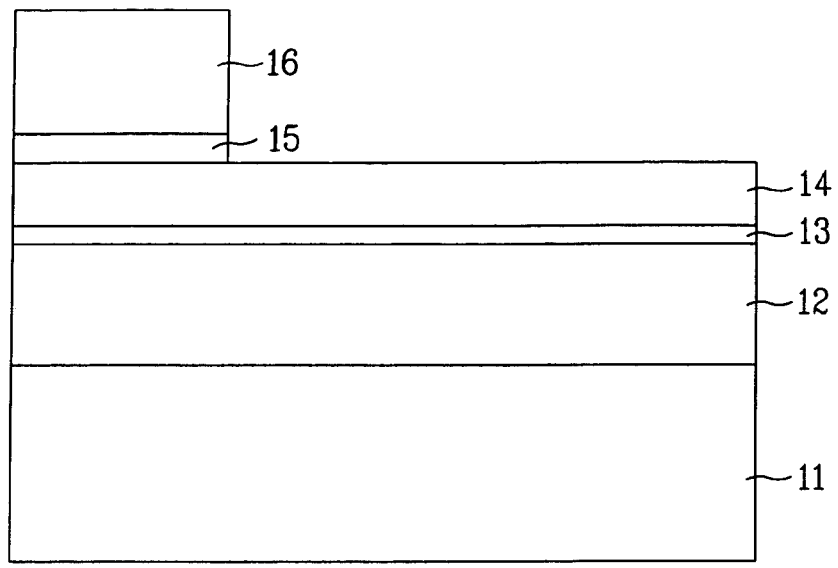
FIG. 1 to FIG. 2 illustrate cross sectional views showing a method of etching an upper metal layer of a capacitor in accordance with the present invention.
Figure 2:
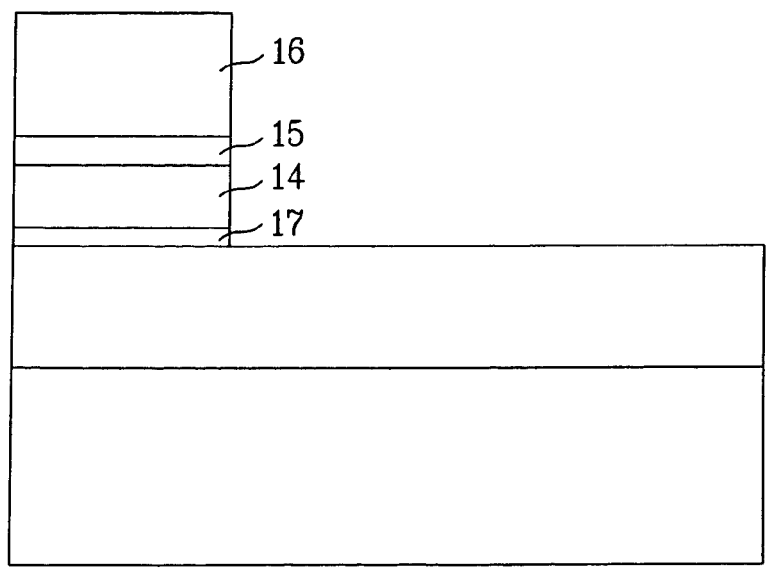

FIG. 1 and FIG. 2 illustrate cross sectional views showing a method of etching an upper metal layer of a capacitor in accordance with the present invention.

FIG. 1 shows a result material 16 formed on an upper nitride layer 15, which in turn is formed on an upper metal layer 14, lower nitride layer 13 (shown as 17 in FIG. 2), lower metal layer 12 and substrate 11.

Upper metal layer 11 is formed of Ti/TiN for example. The lower metal layer 12 is shown as one layer, although it could also be formed as several layers (e.g., Ti/TiN, Al or Cu, and Ti/TiN).

FIG. 1 shows a step of forming a pattern 16 (made of photoresist) on a substrate 11 having a predetermined device formed thereon. The process includes etching an upper nitride film 14 with a mixture of $CHF_3$, Ar and $N_2$ using the pattern. The lower nitride film is then formed of the dielectric substance film of the capacitor by etching. In this instance, the upper metal layer 14 is formed of Ti/TiN.

Then the upper nitride film is etched using the pattern as a mask under a condition of process pressure of 5 to 10 mTorr, source power of 500 to 1500 W, bias power of 100 to 200 W, CHF$_3$ gas of 15 to 25 scm, Ar gas of 100 to 200 scm, and N$_2$ gas of 15 to 20 scm. The resulting structure is shown in FIG. 1. In this instance, the etching of the upper nitride film has a high selectivity ratio for the upper metal layer. In this instance, no more than 25 scm of the CHF$_3$ gas is used. Therefore, the nitride is prevented from being etched by a loading effect.

FIG. 2 shows the steps of over etching the upper nitride layer 15 by more than 50% with mixture of CHF$_3$ gas, Ar and N$_2$, so as to etch into the upper metal layer 14 by a predetermined amount (e.g., 50% ore more) with the mixture of Cl$_2$, CHF$_3$ and Ar. This "rough" etching of the upper metal leaves an uneven surface. However, this unevenness does not propagate to lower levels because another step of etching the remaining portion of the upper metal is performed in an atmosphere of Cl$_2$, CHF$_3$ and Argon, resulting in a smooth surface. Thus, the thin lower nitride layer is made smooth by slightly over etching the upper metal layer.

The over etching of the upper metal film 14 is done under a condition of process pressure of 5 to 10 mTorr, source power of 500 to 1500 W, bias power of 100 to 200 W, CHF$_3$ gas of 15 to 25 scm, Ar gas of 100 to 200 scm, and N$_2$ gas of 15 to 25 scm.

A time etch is carried out on the remaining portion of the upper metal layer under a condition of process pressure of 5 to 10 mTorr, source power of 500 to 1500 W, bias power of 100 to 200 W, Cl$_2$ gas of 40 to 60 scm, CHF$_3$ gas of 5 to 15 scm, and Ar gas of 40 60 scm.

Subsequently, the dielectric substance film 17 of the capacitor is formed by etching the lower nitride film under a condition of process power of 5 to 10 mTorr, source power of 500 to 1500 W, bias power of 100 to 200 W, CHF$_3$ gas of 15 to 25 scm, and Ar gas of 100 to 200 scm.

This application claims the benefit of Korean patent Application No. P2003-02027, filed on Dec. 31, 2003, the entire contents of which is hereby incorporated by reference as if fully set forth herein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

Therefore, the method for etching the upper metal film of a capacitor of the present invention provides a safe method and enhancement of MIM characteristic by over etching the upper metal layer more than 50% with CHF$_3$, Ar, and N$_2$, thereby securing safety of unit process.

What is claimed is:

1. A method for manufacturing a capacitor in a semiconductor device, comprising the steps of: forming in a sequence a lower metal film, a lower nitride film, an upper metal film, and an upper nitride film on a substrate having a predetermined device formed thereon; to form a stacked layer structure forming a pattern over a portion of the stacked layer structure; etching the upper nitride film with CHF$_3$, Ar and N$_2$ using the pattern as a mask; over etching the upper metal film more than 50% with CHF$_3$, Ar and N$_2$ using the pattern as the mask; etching a remaining portion of the upper metal film with CHF$_3$, Ar and Cl$_2$ using the pattern as a mask; and etching the lower nitride film with CHF$_3$ and Ar using the pattern.

2. The method of claim 1, wherein the forming step includes forming the upper metal film with Ti/TiN.

3. The method of claim 1, wherein the step of etching the upper nitride film includes etching under a condition of process pressure of 5 to 10 mTorr, source power of 500 to 1500 W, bias power of 100 to 200 W, CHF$_3$ gas of 15 to 25 scm, Ar gas of 100 to 200 scm, and N$_2$ gas of 15 to 25 scm.

4. The method of claim 1, wherein over etching step includes etching of the upper metal film more than 50% under a condition of process pressure of 5 to 10 mTorr, source power of 500 to 1500 W, bias power of 100 to 200 W, CHF$_3$ gas of 15 to 25 scm, Ar gas of 100 to 200 scm, and N$_2$ gas of 15 to 25 scm.

5. The method of claim 1, wherein the step of etching the remaining portion of the upper metal film includes etching under a condition of process pressure of 5 to 10 mTorr, source power of 500 to 1500 W, bias power of 100 to 200 W, Cl$_2$ gas of 40 to 60 scm, CHF3 gas of 5 to 15 scm, and Ar gas of 40 to 60 scm.

6. The method of claim 1, wherein the step of etching the lower nitride film includes etching under a condition of process pressure of 5 to 10 mTorr, source power of 500 to 1500 W, bias power of 100 to 200 W, CHF$_3$ gas of 15 to 25 scm, and Ar gas of 100 to 200 scm.

* * * * *